(12) United States Patent
Liu et al.

(10) Patent No.: US 10,720,195 B2
(45) Date of Patent: Jul. 21, 2020

(54) EFFICIENT MEMORY ACTIVATION AT RUNTIME

(71) Applicant: INTEL CORPORATION, Santa Clara, CA (US)

(72) Inventors: Zhijun Liu, Shanghai (CN); Jian Tang, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 70 days.

(21) Appl. No.: 15/755,469

(22) PCT Filed: Sep. 25, 2015

(86) PCT No.: PCT/CN2015/090745
§ 371 (c)(1),
(2) Date: Feb. 26, 2018

(87) PCT Pub. No.: WO2017/049594
PCT Pub. Date: Mar. 30, 2017

(65) Prior Publication Data
US 2018/0190332 A1  Jul. 5, 2018

(51) Int. Cl.
*G06F 12/06* (2006.01)
*G11C 7/20* (2006.01)
*G11C 5/04* (2006.01)

(52) U.S. Cl.
CPC ............ *G11C 7/20* (2013.01); *G06F 12/0646* (2013.01); *G11C 5/04* (2013.01)

(58) Field of Classification Search
None
See application file for complete search history.

(56) References Cited

U.S. PATENT DOCUMENTS 9,583,182 B1 * 2/2017 Wilkerson .......... G06F 12/0804
10,546,156 B2 * 1/2020 Poornachandran ..... G06F 21/76
(Continued)

FOREIGN PATENT DOCUMENTS

| CN | 104156176 A | 11/2014 |
| WO | 2014-134808 A1 | 9/2014 |
| WO | 2017-049594 A1 | 3/2017 |

OTHER PUBLICATIONS

International Search Report and Written Opinion issued in PCT Application No. PCT/CN2015/090745, dated Jul. 1, 2016, 12 pages.
(Continued)

*Primary Examiner* — Michael Sun
(74) *Attorney, Agent, or Firm* — Grossman, Tucker, Perreault & Pfleger, PLLC

(57) ABSTRACT

The present disclosure is directed to efficient memory activation at runtime. A memory module (e.g., a memory riser) being added to a device would typically cause the device to enter system management mode (SMM) to activate the memory module. However, activation (e.g., memory module initialization, hardware training and system reconfiguration) in SMM may substantially delay the resumption of normal operations. Consistent with the present disclosure, at least the memory module initialization and hardware training portions of the activation may be performed by an operating system (OS) in the device, allowing normal device operation to continue during the activation. The OS portion of the activation may generate configuration data. In at least one embodiment, the configuration data may be applied for use in SMM. For example, a system management interrupt (SMI) handler may apply the configuration data during a quiescent period (e.g., a period of inactivity) that occurs during SMM.

15 Claims, 3 Drawing Sheets

(56) References Cited

U.S. PATENT DOCUMENTS

| | | |
|---|---|---|
| 2002/0129186 A1 | 9/2002 | Emerson et al. |
| 2004/0243884 A1 | 12/2004 | Vu et al. |
| 2007/0266389 A1 | 11/2007 | Ganguly et al. |
| 2010/0122077 A1* | 5/2010 | Durham ................ G06F 1/3203 713/100 |
| 2012/0254865 A1* | 10/2012 | Saeki ...................... G06F 8/656 718/1 |
| 2013/0097369 A1* | 4/2013 | Talagala .............. G06F 12/0246 711/103 |
| 2016/0043912 A1* | 2/2016 | Schumacher ............. G06F 9/50 714/49 |
| 2016/0118121 A1* | 4/2016 | Kelly .................. G06F 13/4068 710/301 |
| 2017/0060697 A1* | 3/2017 | Berke ................... G06F 3/0619 |
| 2019/0095352 A1* | 3/2019 | Poornachandran ... G06F 9/4413 |
| 2019/0347125 A1* | 11/2019 | Sankaran ............. G06F 9/3877 |

OTHER PUBLICATIONS

International Preliminary Report on Patentability and Written Opinion issued in PCT Application No. PCT/CN2015/090745, dated Mar. 27, 2018, 5 pages.

* cited by examiner

EFFICIENT MEMORY ACTIVATION AT RUNTIME

CROSS-REFERENCE TO RELATED APPLICATIONS

This present application is a National Phase Application Filed Under 35 U.S.C. 371 claiming priority to PCT/CN2015/090745 filed Sep. 25, 2015, the entire disclosure of which is incorporated herein by reference.

TECHNICAL FIELD

This disclosure relates to device hardware reconfiguration, and more particularly, to a system that may more efficiently incorporate memory modules added to a device at runtime.

BACKGROUND

As human interaction becomes increasingly electronic, greater burden may be placed on the underlying electronic infrastructure. For example, personal and professional communication, financial and other transactions, multimedia uploads/downloads (e.g., streaming), etc. may occur repeatedly on a daily basis. A cloud-based architecture for supporting this activity may comprise at least on data server accessible via a network such as a global area network (GAN), a wide area network (WAN) like the Internet, a local area network (LAN), etc. More typically, cloud-based support infrastructures may comprise multiple networked servers configured to operate alone or collaboratively. In this manner, online data solutions may be able to handle substantial amounts of traffic wherein a variety of users may seek to concurrently access the same or different data.

In some instances, the electronic infrastructure must be upgraded to account for increased data processing loads. Increased data processing capacity may be required to accommodate, for example, heavy data streaming loads for newly offered digital content or widely-viewed sporting events, increased electronic purchase transaction volume during high-volume gift giving seasons, increased electronic communication handling during emergencies or natural disasters, increased complexity mathematical or statistical analysis, etc. In at least one example scenario, additional memory capacity may be required to handle more data processing. In an active data processing operation it may not be possible to power down the equipment, and so additional memory must be added during runtime (e.g., while the system is still running) Existing systems may allow for additional memory to be added while the system is running. The running system may eventually activate the newly added memory and integrate the new memory for use in data processing tasks. However, the manner in which the newly added memory is brought online (e.g., integrated and made active) in the system is not immediate, efficient, etc. As a result, while new memory may be added to devices that require additional resources, the benefit of the new resources is delayed.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
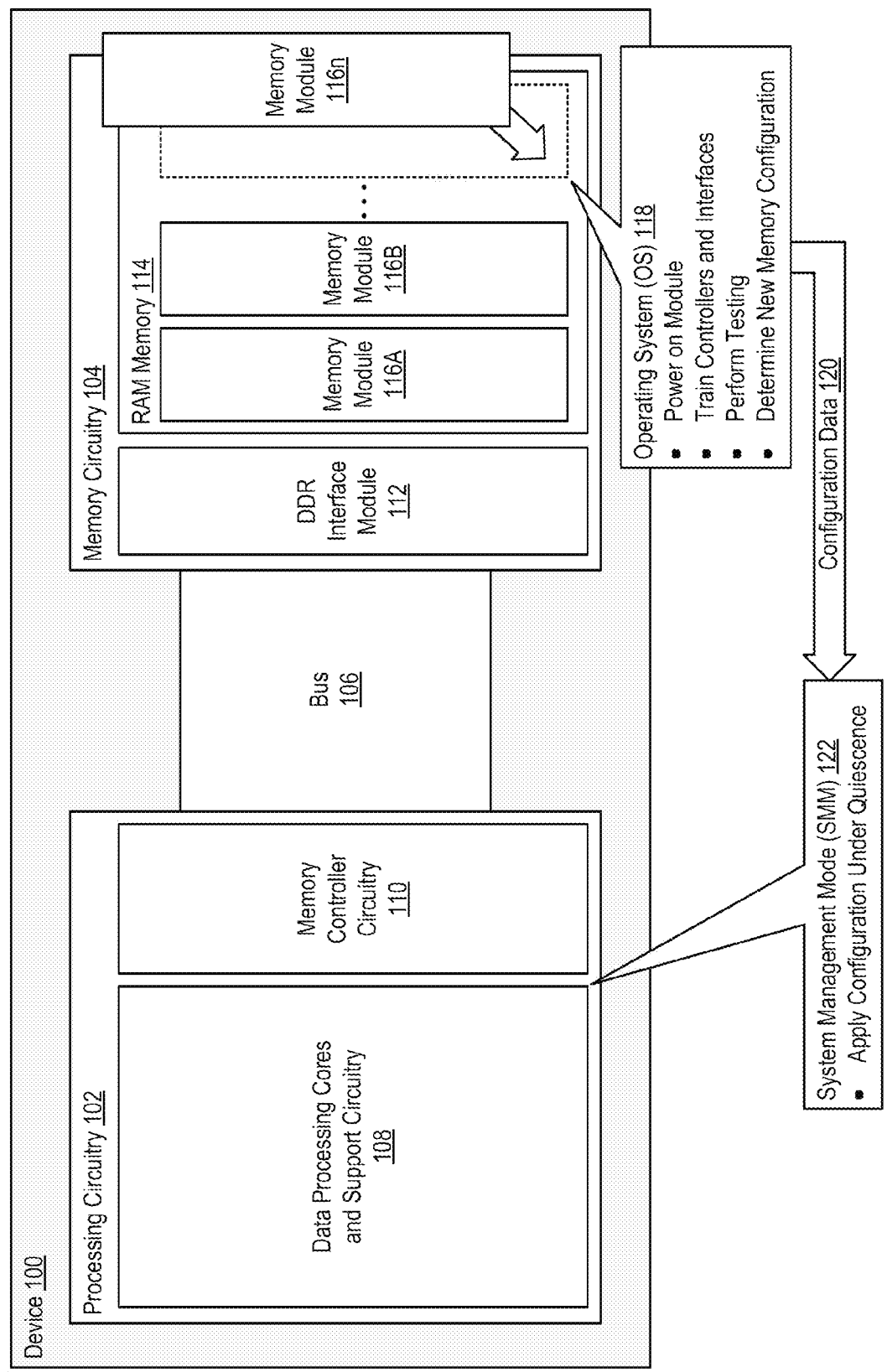
FIG. 1 illustrates an example device capable of efficient memory activation at runtime in accordance with at least one embodiment of the present disclosure.

Although the following Detailed Description will proceed with reference being made to illustrative embodiments, many alternatives, modifications and variations thereof will be apparent to those skilled in the art.

DETAILED DESCRIPTION

The present disclosure is directed to efficient memory activation at runtime. A memory module (e.g., a memory riser) being added to a device would typically cause the device to enter system management mode (SMM) to activate the memory module. However, memory activation (e.g., memory module initialization, hardware training and system reconfiguration) in SMM may substantially delay the resumption of normal operations. Consistent with the present disclosure, at least the memory module initialization and hardware training portions of the activation may be performed by an operating system (OS) in the device, allowing normal device operation to continue during the activation. The OS portion of the activation may generate configuration data to be applied during system reconfiguration. In at least one embodiment, the configuration data may be applied for use in SMM. For example, a system management interrupt (SMI) handler may apply the configuration data during a quiescent period (e.g., a period of inactivity) during SMM. Operating in this manner minimizes the delay to resume normal operation, which makes activating new memory much more efficient.

In at least one embodiment, an example device capable of activating memory at runtime may comprise at least processing circuitry and memory circuitry. The processing circuitry may be to execute operations related to at least an OS in the device and to suspend execution of the operations when in SMM. The memory circuitry may be to receive at least one memory module, wherein upon receiving the at least one memory module the memory circuitry is to trigger the OS to at least prepare configuration data related to the at least one memory module for application during a quiescent period in the device, wherein the processing circuitry is to apply the configuration data during the quiescent period that is initiated after entering the SMM.

In at least one embodiment, the at least one memory module may comprise at least one memory riser including at least one dual in-line memory module (DIMM). The OS may further be to perform operations related to activating the at least one memory module. The memory activation operations may comprise, for example, causing the device to provide power to the at least one memory module. The processing circuitry may comprise at least memory controller circuitry and the memory activation operations may further comprise, for example, training the memory controller circuitry to interact with the at least one memory module. The memory circuitry may comprise at least dual data rate (DDR) interface circuitry, and the memory activation operations may comprise, for example, training the DDR interface circuitry to interact with the at least one memory module. The memory activation operations may further comprise testing at least one of the memory controller circuitry or the dual data rate circuitry with the at least one memory module.

In the same or a different embodiment, in preparing the configuration data the OS may further be to configure at least one of operational features of the at least one memory module or address decoding corresponding to the at least one memory module. The OS may further be to provide the configuration data to an SMI handler in the processing circuitry to apply during the SMM. Consistent with the present disclosure, an example method for activating memory at runtime in a device may comprise powering on at least one memory module received in memory circuitry in the device, causing an OS in the device to perform memory activation operations including at least preparing configuration data related to the at least one memory module to be applied during a quiescent period occurring in a SMM in the device, causing the OS to provide the configuration data to processing circuitry in the device, causing the processing circuitry to enter a SMM in the device and causing the processing circuitry to apply the configuration data during the quiescent period.

FIG. 1 illustrates an example device capable of efficient memory activation at runtime in accordance with at least one embodiment of the present disclosure. In describing various embodiments consistent with the present disclosure, reference may be made to certain types of components such as memory and memory risers, SMM including SMI handler operations, etc. These examples have been utilized to provide a readily comprehensible perspective for understanding the disclosed embodiments, and are not intended to limit implementations to only using these components, technologies, etc. Moreover, the inclusion of an apostrophe after an item number in a figure (e.g., 100') may indicate that an example embodiment of the item is being shown. These example embodiments are not intended to limit the disclosure to only what is illustrated, and have been presented herein merely for the sake of explanation. As referenced herein, SMM may be a hardware-initiated operational mode that halts normal operation in the device (e.g., including the OS). System-wide operations may be performed with high privilege during SMM by software such as an SMI, an instruction interpreter and/or debugger, etc. SMM is entered through SMI execution, and may halt device operations only for a certain time period to avoid damaging the OS (e.g., causing the OS to become unstable).

An example configuration for device 100 is disclosed in FIG. 1. Examples of device 100 may include, but are not limited to, a mobile communication device such as a cellular handset or a smartphone based on the Android® OS from the Google Corporation, iOS® or Mac OS® from the Apple Corporation, Windows® OS from the Microsoft Corporation, Linux® OS, Tizen® OS and/or other similar operating systems that may be deemed derivatives of Linux® OS from the Linux Foundation, Firefox® OS from the Mozilla Project, Blackberry® OS from the Blackberry Corporation, Palm® OS from the Hewlett-Packard Corporation, Symbian® OS from the Symbian Foundation, etc., a mobile computing device such as a tablet computer like an iPad® from the Apple Corporation, Surface® from the Microsoft Corporation, Galaxy Tab® from the Samsung Corporation, Kindle® from the Amazon Corporation, etc., an Ultrabook® including a low-power chipset from the Intel Corporation, a netbook, a notebook, a laptop, a palmtop, etc., a wearable device such as a wristwatch form factor computing device like the Galaxy Gear® from Samsung, Apple Watch® from the Apple Corporation, etc., an eyewear form factor computing device/user interface like Google Glass® from the Google Corporation, a virtual reality (VR) headset device like the Gear VR® from the Samsung Corporation, the Oculus Rift® from the Oculus VR Corporation, etc., a typically stationary computing device such as a desktop computer, a server, a group of computing devices organized in a high performance computing (HPC) architecture, a smart television or other type of "smart" device, small form factor computing solutions (e.g., for space-limited applications, TV set-top boxes, etc.) like the Next Unit of Computing (NUC) platform from the Intel Corporation, etc.

Device 100 may comprise, for example, at least processing circuitry 102 and memory circuitry 104 coupled by at least one bus structure 106. In general, processing circuitry 102 may receive data to process from memory circuitry 104 via bus 106, and may send processed data to memory circuitry 104 via bus 106. Processing circuitry 102 may include at least data processing cores and support circuitry 108 (hereafter, "cores/support 108") and memory controller circuitry 110. Cores/support 108 may comprise one or more data processing cores and support circuitry such as, but not limited to, cache memory circuitry to temporarily store data for each data processing core, security circuitry (e.g., a memory encryption engine), etc. Memory controller circuitry 110 may control how cores/support 108 access memory circuitry 104 (e.g., including at least how data is read from, and written to, memory circuitry 104).

Memory circuitry 104 may comprise, for example, at least DDR interface module 112 and random access memory (RAM) 114. For the sake of clarity, only RAM memory 114 has been shown in FIG. 1. Other types of memory that may be included in memory circuitry 104 will be discussed in regard to FIG. 2. DDR interface 112 may serve as the physical interface between RAM memory 114 and device 100 (e.g., including processing circuitry 102), and in this regard may control the timing by which data is written to, and read from, RAM memory 114. RAM memory 114 may comprise at least one memory module 116, but in the example shown in FIG. 1 comprises memory module 116A, memory module 116B . . . memory module 116n (collectively, "memory modules 116A . . . n"). Memory modules 116A . . . n may include one or more memory integrated circuits (ICs), single in-line memory modules (SIMMs) or DIMMS that may include one or more ICs, higher capacity structures such as memory risers that may comprise one or more SIMMS or DIMMS, etc. For example, a single memory riser may include 192 gigabytes (GB) of RAM memory (e.g., twelve 16 GB registered DIMMS).

Taking as an example the activation of a 192 GB memory riser in a server, in existing memory activations an SMI handler may execute all required operations in about 3.5 minutes. While the SMI is working in SMM, the OS is frozen and system timer is also stopped. After activation the OS may resume operation and adds the new memory capacity to OS resource pool. The result of this operation utilizing typical procedures is that the system may lose 3.5 minutes or more of operational time which is lost by the system having to operate in SMM. This solution is not acceptable for a commercial OS because normally each SMI interrupt should adhere to the SMI latency limitation to avoid any side effects to OS. An alternative to the current procedure wherein the SMI totally stops system operation is to use "sliced" SMIs to perform the activation. In sliced SMIs periodic SMIs are triggered. During each SMI the SMI handler will execute a piece of code to bring the new memory online, and then returns back to OS within the allowed latency limitation. The operation to activate the memory may continue in next periodic SMI. With slicing, activation of the 192 GB memory riser has been observed to take about two hours or more, depending on the implementation of device 100.

Consistent with the present disclosure, the impact of activating new memory in device 100 may be reduced from typical procedures such as described above. The time savings may be realized at least by substantially reducing the amount of time device 100 needs to spend in SMM. As shown in the example of FIG. 1, memory module 116*n* may be received into (e.g., inserted into) RAM memory 114. The addition of memory module 116*n* may trigger various activation-related operations in OS 118 (e.g., memory module initialization and hardware training operations). For example, OS 118 may power on memory module 116, train (e.g., reconfigure) controllers and interfaces to interact with memory module 116*n*, perform testing regarding memory module 116*n* and determine a new memory configuration for device 100 (e.g., and OS 118). All of the activation-related operations may occur in the background of OS 118 while the normal operation of device 100 continues. Configuration data 120 may then be provided to processing circuitry 102. Processing circuitry 102 may enter SMM 122 to perform system reconfiguration operations wherein, for example, configuration data 102 may be applied for use (e.g. put into operation). The application of configuration data 120 may occur during a quiescent (e.g., inactive) period occurring in SMM 122. The quiescent period may be a period of time wherein all in-process memory transactions are allowed to complete and all pending memory transactions are temporarily paused so that there are no active memory transactions when configuration data 120 is applied. As a result, the new memory module 116*n* may be brought online (e.g., activated) with device 100 only having to spend a minimal amount of time in SMM 122. In practice it has been observed in activating a 192 GB memory riser that approximately 99.52% of the memory activation may be moved from SMM 122 to OS 118, leaving only minimal system reconfiguration to be performed in SMM 122 (e.g., about 0.48% of the activation), which may decrease the time that OS 118 must be suspended and increases system performance, memory online efficiency, etc.

Figure 2:
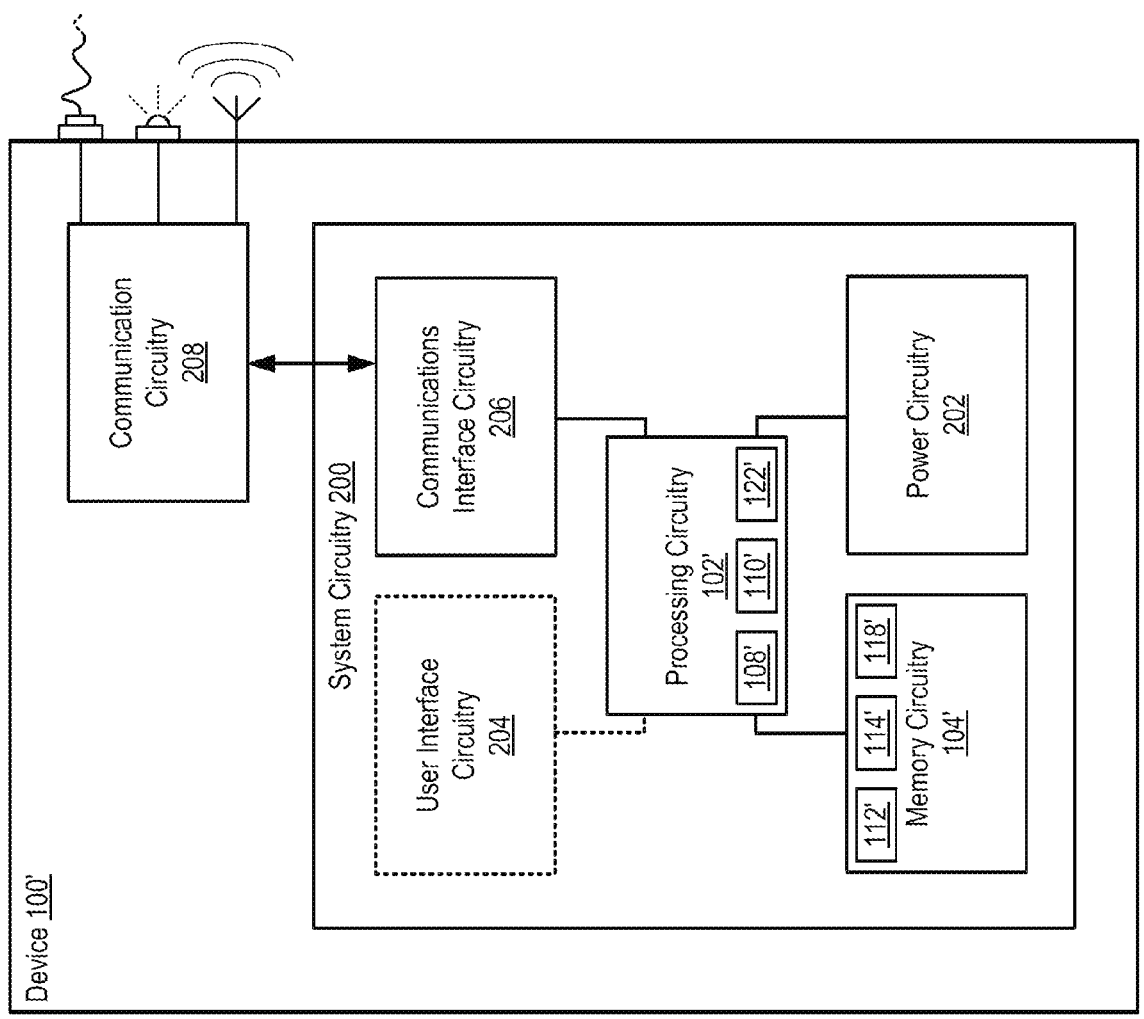
FIG. 2 illustrates an example configuration for a device usable in accordance with at least one embodiment of the present disclosure.

FIG. 2 illustrates an example configuration for a device usable in accordance with at least one embodiment of the present disclosure. For example, device 100' may be able to perform any or all of the activities shown in FIG. 1. However, device 100' is presented only as an example of an apparatus usable in embodiments consistent with the present disclosure, and is not intended to limit any of the embodiments to a particular manner of implementation.

System circuitry 200 may manage the operation of device 100'. System circuitry 200 may include, for example, processing circuitry 102', memory circuitry 104', power circuitry 202, user interface circuitry 204 and communication interface circuitry 206. Device 100' may also include communication circuitry 208. While communication circuitry 208 is shown as separate from system circuitry 200, the example configuration illustrated in FIG. 2 has been provided merely for the sake of explanation. Some or all of the functionality associated with communication circuitry 208 may also be incorporated into system circuitry 200.

In device 100', cores/support 108' in processing circuitry 102' may comprise one or more processors situated in separate components, or alternatively one or more processing cores in a single component (e.g., in a System-on-a-Chip (SoC) configuration), along with processor-related support circuitry (e.g., bridging interfaces, etc.). Example processors may include, but are not limited to, various x86-based microprocessors available from the Intel Corporation including those in the Pentium, Xeon, Itanium, Celeron, Atom, Quark, Core i-series, Core M-series product families, Advanced RISC (e.g., Reduced Instruction Set Computing) Machine or "ARM" processors, etc. Examples of support circuitry may include chipsets (e.g., Northbridge, Southbridge, etc. available from the Intel Corporation) configured to provide an interface through which processing circuitry 102' may interact with other system components that may be operating at different speeds, on different buses, etc. in device 100'. Moreover, some or all of the functionality commonly associated with the support circuitry may also be included in the same physical package as the processor (e.g., such as in the Sandy Bridge family of processors available from the Intel Corporation). As described in regard to FIG. 1, processing circuitry 102' may further comprise at least memory controller circuitry 110' and may be configured to enter SMM 122' (e.g., when triggered by an SMI).

Processing circuitry 102' may be configured to execute various instructions in device 100'. Instructions may include program code configured to cause processing circuitry 102' to perform activities related to reading data, writing data, processing data, formulating data, converting data, transforming data, etc. Information (e.g., instructions, data, etc.) may be stored in memory circuitry 104'. Memory circuitry 104' may comprise random access memory (RAM) and/or read-only memory (ROM) in a fixed or removable format. RAM may include volatile memory configured to hold information during the operation of device 100' such as, for example, static RAM (SRAM) or Dynamic RAM (DRAM). ROM may include non-volatile (NV) memory circuitry configured based on BIOS, UEFI, etc. to provide instructions when device 100' is activated, programmable memories such as electronic programmable ROMs (EPROMS), Flash, etc. Other fixed/removable memory may include, but are not limited to, magnetic memories such as, for example, floppy disks, hard drives, etc., electronic memories such as solid state flash memory (e.g., embedded multimedia card (eMMC), etc.), removable memory cards or sticks (e.g., micro storage device (uSD), USB, etc.), optical memories such as compact disc-based ROM (CD-ROM), Digital Video Disks (DVD), Blu-Ray Disks, etc. As described in regard to FIG. 1, memory circuitry 104' may comprise at least DDR interface module 112', RAM memory 114' and may be configured to store within nonvolatile memory, load and retain in volatile memory during runtime OS 118'.

Power circuitry 202 may include internal power sources (e.g., a battery, fuel cell, etc.) and/or external power sources (e.g., electromechanical or solar generator, power grid, external fuel cell, etc.), and related circuitry configured to supply device 100' with the power needed to operate. User interface circuitry 204 may include hardware and/or software to allow users to interact with device 100' such as, for example, various input mechanisms (e.g., microphones, switches, buttons, knobs, keyboards, speakers, touch-sensitive surfaces, one or more sensors configured to capture images and/or sense proximity, distance, motion, gestures, orientation, biometric data, etc.) and various output mechanisms (e.g., speakers, displays, lighted/flashing indicators, electromechanical components for vibration, motion, etc.). The hardware in user interface circuitry 204 may be incorporated within device 100' and/or may be coupled to device 100' via a wired or wireless communication medium. User interface circuitry 204 may be optional in certain circumstances such as, for example, a situation wherein device 100' is a server (e.g., rack server, blade server, etc.) that does not include user interface circuitry 204, and instead relies on another device (e.g., a management terminal) for user interface functionality.

Communication interface circuitry 206 may be configured to manage packet routing and other control functions for communication circuitry 208, which may include resources configured to support wired and/or wireless communications. In some instances, device 100' may comprise more than one set of communication circuitry 208 (e.g., including separate physical interface circuitry for wired protocols and/or wireless radios) managed by centralized communication interface circuitry 206. Wired communications may include serial and parallel wired mediums such as, for example, Ethernet, USB, Firewire, Thunderbolt, Digital Video Interface (DVI), High-Definition Multimedia Interface (HDMI), etc. Wireless communications may include, for example, close-proximity wireless mediums (e.g., radio frequency (RF) such as based on the RF Identification (RFID) or Near Field Communications (NFC) standards, infrared (IR), etc.), short-range wireless mediums (e.g., Bluetooth, WLAN, Wi-Fi, etc.), long range wireless mediums (e.g., cellular wide-area radio communication technology, satellite-based communications, etc.), electronic communications via sound waves, etc. In one embodiment, communication interface circuitry 206 may be configured to prevent wireless communications that are active in communication circuitry 208 from interfering with each other. In performing this function, communication interface circuitry 206 may schedule activities for communication circuitry 208 based on, for example, the relative priority of messages awaiting transmission. While the embodiment disclosed in FIG. 2 illustrates communication interface circuitry 206 being separate from communication circuitry 208, it may also be possible for the functionality of communication interface circuitry 206 and communication circuitry 208 to be incorporated into the same circuitry.

Figure 3:
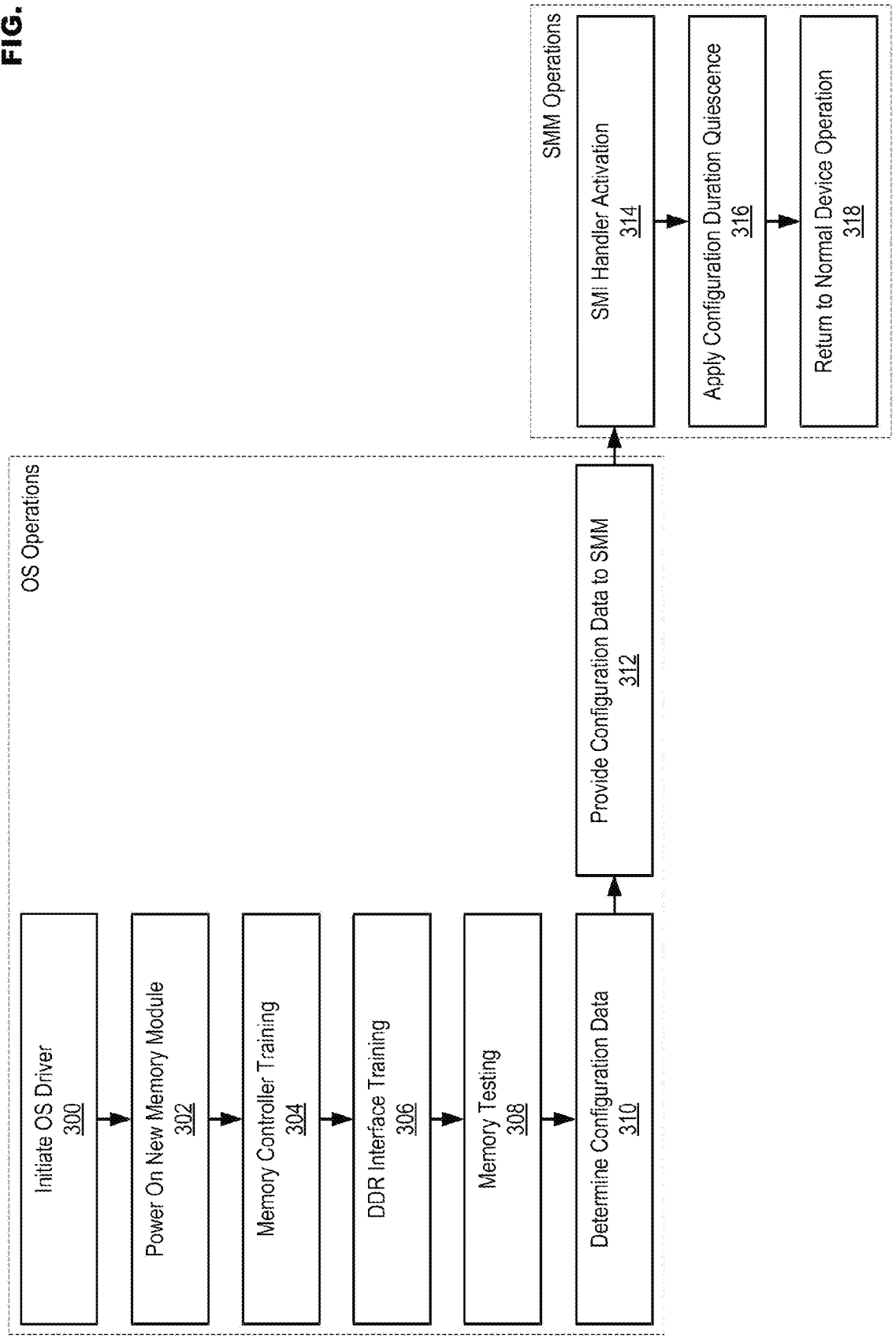
FIG. 3 illustrates example operations for efficient memory activation at runtime in accordance with at least one embodiment of the present disclosure.

FIG. 3 illustrates example operations for efficient memory activation at runtime in accordance with at least one embodiment of the present disclosure. For example, operations 300 to 312 may be generally directed to memory module initialization and hardware training and may be performed by at least an OS in a device, while operations 314 to 318 may be generally directed to device reconfiguration and may be performed by at least processing circuitry in the device after entry into SMM. In operation 300, an OS driver may be initiated. For example, the OS driver may be triggered by at least one memory module being received in memory circuitry in the device (e.g., the insertion of at least one new memory riser into a socket in the memory circuitry may trigger the OS driver).

The OS may then cause the new memory module to be powered on in operation 302. In operation 304, a memory controller in the device (e.g., in the processing circuitry) may be trained. Training may involve reconfiguring the memory controller to interact with the new memory module based on, for example, the amount, type, speed, etc. of memory in the new memory module, whether any DIMMs in the memory module are registered (RDIMMS), the wiring architecture of the new memory module, etc. Memory controller training in operation 304 may be followed by DDR interface training in operation 306. DDR interface training may include, for example, at least configuring the timing parameters in the DDR interface to operate with the speed of the memory in the new memory module. The memory module may be tested (e.g., with the reconfigured memory controller and DDR interface) in operation 308.

The determination of configuration data may occur in operation 310. Operation 310 may include memory setup configuration such as, but not limited to, determining single data rate correction (SDDC) and/or double data rate correction (DDDC), memory sparing wherein at least a portion of the memory in the new memory module may be held in reserve in case of primary memory failures, determining system address decoding (SAD) and/or target address decoding (TAD) tables, etc. Consistent with the present disclosure, the configuration data be applied only during a quiescent period that occurs during SMM. Thus, in operation 312 the configuration data may be provided to the SMM (e.g., or to the processing circuitry that will then enter SMM). A SMI handler in the processing circuitry may initiate the SMM based on an SMI in operation 314. After quiescence is established (e.g., after it is established that no memory transactions are still in-process and no new memory transactions are initiating), then in operation 316 the configuration data may be applied. Application of the configuration data may cause the configuration data to become the configuration used by the device to interact with the memory now including the new memory module that was activated (e.g., "brought online"). Normal device operation may resume in operation 318. Normal operation may continue until, for example, a new memory module is added, an existing memory module is replaced, etc., which may again trigger the initiation of the OS driver in operation 300.

While FIG. 3 illustrates operations according to an embodiment, it is to be understood that not all of the operations depicted in FIG. 3 are necessary for other embodiments. Indeed, it is fully contemplated herein that in other embodiments of the present disclosure, the operations depicted in FIG. 3, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The modules may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more storage mediums (e.g., non-transitory storage mediums) having stored thereon, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software modules executed by a programmable control device.

Thus, the present disclosure is directed to efficient memory activation at runtime. A memory module (e.g., a memory riser) being added to a device would typically cause the device to enter system management mode (SMM) to activate the memory module. However, activation (e.g., memory module initialization, hardware training and system reconfiguration) in SMM may substantially delay the resumption of normal operations. Consistent with the present disclosure, at least the memory module initialization and hardware training portions of the activation may be performed by an operating system (OS) in the device, allowing normal device operation to continue during the activation. The OS portion of the activation may generate configuration data. In at least one embodiment, the configuration data may be applied for use in SMM. For example, a system management interrupt (SMI) handler may apply the configuration data during a quiescent period (e.g., a period of inactivity) that occurs during SMM.

The following examples pertain to further embodiments. The following examples of the present disclosure may comprise subject material such as a device, a method, at least one machine-readable medium for storing instructions that when executed cause a machine to perform acts based on the method, means for performing acts based on the method and/or a system for efficient memory activation at runtime.

According to example 1 there is provided a device capable of activating memory at runtime. The device may comprise processing circuitry to execute operations related to at least an operating system in the device and to suspend execution of the operations when in system management mode and memory circuitry to receive at least one memory module, wherein upon receiving the at least one memory module the memory circuitry is to trigger the operating system to at least prepare configuration data related to the at least one memory module for application during a quiescent period in the device, wherein the processing circuitry is to apply the configuration data during the quiescent period that is initiated after entering the system management mode.

Example 2 may include the elements of example 1, wherein the at least one memory module comprises at least one memory riser including at least one dual in-line memory module.

Example 3 may include the elements of any of examples 1 to 2, wherein the processing circuitry and the memory circuitry are coupled by at least one bus.

Example 4 may include the elements of any of examples 1 to 3, wherein the operating system is further to perform operations related to activating the at least one memory module.

Example 5 may include the elements of example 4, wherein the memory activation operations comprise causing the device to provide power to the at least one memory module.

Example 6 may include the elements of any of examples 4 to 5, wherein the processing circuitry comprises at least memory controller circuitry and the memory activation operations comprise training the memory controller circuitry to interact with the at least one memory module.

Example 7 may include the elements of example 6, wherein the memory circuitry comprises at least dual data rate interface circuitry and the memory activation operations comprise training the dual data rate interface circuitry to interact with the at least one memory module.

Example 8 may include the elements of example 7, wherein training the dual data rate circuitry comprises establishing timing for the dual data rate circuitry to interact with the at least one memory module.

Example 9 may include the elements of any of examples 7 to 8, wherein the memory activation operations comprise testing at least one of the memory controller circuitry or the dual data rate circuitry with the at least one memory module.

Example 10 may include the elements of any of examples 4 to 9, wherein in preparing the configuration data the operating system is to configure at least one of operational features of the at least one memory module or address decoding corresponding to the at least one memory module.

Example 11 may include the elements of example 10, wherein configuring address decoding comprises configuring at least one of a system address decoding table or a target address decoding table.

Example 12 may include the elements of any of examples 1 to 11, wherein the operating system is to provide the configuration data to a system management interrupt handler in the processing circuitry to apply during the system management mode.

According to example 13 there is provided a method for activating memory at runtime in a device. The method may comprise powering on at least one memory module received in memory circuitry in the device, causing an operating system in the device to perform memory activation operations including at least preparing configuration data related to the at least one memory module to be applied during a quiescent period occurring in a system management mode in the device, causing the operating system to provide the configuration data to processing circuitry in the device, causing the processing circuitry to enter system management mode in the device and causing the processing circuitry to apply the configuration data during the quiescent period.

Example 14 may include the elements of example 13, and may further comprise initializing a driver for the at least one memory module in the operating system prior to powering on the at least one memory module.

Example 15 may include the elements of any of examples 13 to 14, wherein the at least one memory module comprises at least one memory riser including at least one dual in-line memory module.

Example 16 may include the elements of any of examples 13 to 15, wherein performing the memory activation operations comprises training memory controller circuitry in the processing circuitry to interact with the at least one memory module.

Example 17 may include the elements of example 16, wherein performing the memory activation operations comprises training dual data rate interface circuitry in the memory circuitry to interact with the at least one memory module.

Example 18 may include the elements of example 17, wherein training the dual data rate circuitry comprises establishing timing for the dual data rate circuitry to interact with the at least one memory module.

Example 19 may include the elements of any of examples 17 to 18, wherein performing the memory activation operations comprises testing at least one of the memory controller circuitry or the dual data rate circuitry with the at least one memory module.

Example 20 may include the elements of any of examples 13 to 19, wherein preparing the configuration data comprises configuring at least one of operational features of the at least one memory module or address decoding corresponding to the at least one memory module.

Example 21 may include the elements of example 20, wherein configuring address decoding comprises configuring at least one of a system address decoding table or a target address decoding table.

Example 22 may include the elements of any of examples 13 to 21, wherein the configuration data is provided to a system management interrupt handler in the processing circuitry to apply during the system management mode.

According to example 23 there is provided a system including at least a device, the system being arranged to perform the method of any of the above examples 13 to 22.

According to example 24 there is provided a chipset arranged to perform the method of any of the above examples 13 to 22.

According to example 25 there is provided at least one machine readable medium comprising a plurality of instructions that, in response to be being executed on a computing device, cause the computing device to carry out the method according to any of the above examples 13 to 22.

According to example 26 there is provided a device configured for activating memory at runtime, the device being arranged to perform the method of any of the above examples 13 to 22.

According to example 27 there is provided at least one machine-readable storage device. The machine readable storage device may have stored thereon, individually or in combination, instructions for activating memory at runtime in a device that, when executed by one or more processors, cause the one or more processors to power on at least one memory module received in memory circuitry in a device, cause an operating system in the device to perform memory activation operations including at least preparing configuration data related to the at least one memory module to be applied during a quiescent period occurring in a system management mode in the device, cause the operating system to provide the configuration data to processing circuitry in the device, cause the processing circuitry to enter system management mode in the device and cause the processing circuitry to apply the configuration data during the quiescent period.

Example 28 may include the elements of example 27, and may further comprise instructions that, when executed by one or more processors, cause the one or more processors to initialize a driver for the at least one memory module in the operating system prior to powering on the at least one memory module.

Example 29 may include the elements of any of examples 27 to 28, wherein the at least one memory module comprises at least one memory riser including at least one dual in-line memory module.

Example 30 may include the elements of any of examples 27 to 29, wherein the instructions to perform the memory activation operations comprise instructions to train memory controller circuitry in the processing circuitry to interact with the at least one memory module.

Example 31 may include the elements of example 30, wherein the instructions to perform the memory activation operations comprise instructions to train dual data rate interface circuitry in the memory circuitry to interact with the at least one memory module.

Example 32 may include the elements of example 31, wherein the instructions to train the dual data rate circuitry comprise instructions to establish timing for the dual data rate circuitry to interact with the at least one memory module.

Example 33 may include the elements of any of examples 31 to 32, wherein the instructions to perform the memory activation operation comprises instructions to test at least one of the memory controller circuitry or the dual data rate circuitry with the at least one memory module.

Example 34 may include the elements of any of examples 27 to 33, wherein the instructions to prepare the configuration data comprises instructions to configure at least one of operational features of the at least one memory module or address decoding corresponding to the at least one memory module.

Example 35 may include the elements of example 34, wherein the instructions to configure address decoding comprise instructions to configure at least one of a system address decoding table or a target address decoding table.

Example 36 may include the elements of any of examples 27 to 35, wherein the configuration data is provided to a system management interrupt handler in the processing circuitry to apply during the system management mode.

According to example 37 there is provided a system for activating memory at runtime in a device. The system may comprise means for powering on at least one memory module received in memory circuitry in a device, means for causing an operating system in the device to perform memory activation operations including at least preparing configuration data related to the at least one memory module to be applied during a quiescent period occurring in a system management mode in the device, means for causing the operating system to provide the configuration data to processing circuitry in the device, means for causing the processing circuitry to enter system management mode in the device and means for causing the processing circuitry to apply the configuration data during the quiescent period.

Example 38 may include the elements of example 37, and may further comprise means for initializing a driver for the at least one memory module in the operating system prior to powering on the at least one memory module.

Example 39 may include the elements of any of examples 37 to 38, wherein the at least one memory module comprises at least one memory riser including at least one dual in-line memory module.

Example 40 may include the elements of any of examples 37 to 39, wherein the means for performing the memory activation operations comprise means for training memory controller circuitry in the processing circuitry to interact with the at least one memory module.

Example 41 may include the elements of example 40, wherein the means for performing the memory activation operations comprise means for training dual data rate interface circuitry in the memory circuitry to interact with the at least one memory module.

Example 42 may include the elements of example 41, wherein the means for training the dual data rate circuitry comprise means for establishing timing for the dual data rate circuitry to interact with the at least one memory module.

Example 43 may include the elements of any of examples 41 to 42, wherein the means for performing the memory activation operation comprises means for testing at least one of the memory controller circuitry or the dual data rate circuitry with the at least one memory module.

Example 44 may include the elements of any of examples 37 to 43, wherein the means for preparing the configuration data comprises means for configuring at least one of operational features of the at least one memory module or address decoding corresponding to the at least one memory module.

Example 45 may include the elements of example 44, wherein the means for configuring address decoding comprise means for configuring at least one of a system address decoding table or a target address decoding table.

Example 46 may include the elements of any of examples 37 to 45, wherein the configuration data is provided to a system management interrupt handler in the processing circuitry to apply during the system management mode.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A device capable of activating memory at runtime, comprising:
   processing circuitry to execute operations related to at least an operating system in the device and to suspend execution of the operations when in system management mode; and
   memory circuitry to receive at least one memory module, wherein upon receiving the at least one memory module the memory circuitry is to trigger the operating system to at least prepare configuration data related to the at least one memory module for application during a quiescent period in the device, wherein the processing circuitry is to apply the configuration data during the quiescent period that is initiated after entering the system management mode;
      wherein the operating system is further to perform operations related to activating the at least one memory module;
      wherein the processing circuitry comprises at least memory controller circuitry and the memory activation operations comprise training the memory controller circuitry to interact with the at least one memory module;
      wherein the memory circuitry comprises at least dual data rate interface circuitry and the memory activation operations comprise training the dual data rate interface circuitry to interact with the at least one memory module; and
      wherein the memory activation operations comprise testing at least one of the memory controller circuitry or the dual data rate circuitry with the at least one memory module.

2. The device of claim 1, wherein the at least one memory module comprises at least one memory riser including at least one dual in-line memory module.

3. The device of claim 1, wherein the memory activation operations comprise causing the device to provide power to the at least one memory module.

4. The device of claim 1, wherein in preparing the configuration data the operating system is to configure at least one of operational features of the at least one memory module or address decoding corresponding to the at least one memory module.

5. The device of claim 1, wherein the operating system is to provide the configuration data to a system management interrupt handler in the processing circuitry to apply during the system management mode.

6. A method for activating memory at runtime in a device, comprising:
   powering on at least one memory module received in memory circuitry in the device;
   causing an operating system in the device to perform memory activation operations including at least preparing configuration data related to the at least one memory module to be applied during a quiescent period occurring in a system management mode in the device;
   causing the operating system to provide the configuration data to processing circuitry in the device;
   causing the processing circuitry to enter system management mode in the device; and
   causing the processing circuitry to apply the configuration data during the quiescent period;
      wherein performing the memory activation operations comprises training memory controller circuitry in the processing circuitry to interact with the at least one memory module;
      wherein performing the memory activation operations comprises training dual data rate interface circuitry in the memory circuitry to interact with the at least one memory module; and
      wherein performing the memory activation operations comprises testing at least one of the memory controller circuitry or the dual data rate circuitry with the at least one memory module.

7. The method of claim 6, further comprising:
   initializing a driver for the at least one memory module in the operating system prior to powering on the at least one memory module.

8. The method of claim 6, wherein the at least one memory module comprises at least one memory riser including at least one dual in-line memory module.

9. The method of claim 6, wherein preparing the configuration data comprises configuring at least one of operational features of the at least one memory module or address decoding corresponding to the at least one memory module.

10. The method of claim 6, wherein the configuration data is provided to a system management interrupt handler in the processing circuitry to apply during the system management mode.

11. At least one machine-readable storage device having stored thereon, individually or in combination, instructions for activating memory at runtime in a device that, when executed by one or more processors, cause the one or more processors to:

power on at least one memory module received in memory circuitry in a device;

cause an operating system in the device to perform memory activation operations including at least preparing configuration data related to the at least one memory module to be applied during a quiescent period occurring in a system management mode in the device;

cause the operating system to provide the configuration data to processing circuitry in the device;

cause the processing circuitry to enter system management mode in the device; and cause the processing circuitry to apply the configuration data during the quiescent period;

wherein the instructions to perform the memory activation operations comprise instructions to train memory controller circuitry in the processing circuitry to interact with the at least one memory module;

wherein the instructions to perform the memory activation operations comprise instructions to train dual data rate interface circuitry in the memory circuitry to interact with the at least one memory module; and wherein the instructions to perform the memory activation operation comprises instructions to test at least one of the memory controller circuitry or the dual data rate circuitry with the at least one memory module.

12. The machine-readable storage device of claim 11, further comprising, instructions that, when executed by one or more processors, cause the one or more processors to:

initialize a driver for the at least one memory module in the operating system prior to powering on the at least one memory module.

13. The machine-readable storage device of claim 11, wherein the at least one memory module comprises at least one memory riser including at least one dual in-line memory module.

14. The machine-readable storage device of claim 11, wherein the instructions to prepare the configuration data comprises instructions to configure at least one of operational features of the at least one memory module or address decoding corresponding to the at least one memory module.

15. The machine-readable storage device of claim 11, wherein the configuration data is provided to a system management interrupt handler in the processing circuitry to apply during the system management mode.

* * * * *